United States Patent
Linares et al.

(10) Patent No.: US 11,690,197 B2
(45) Date of Patent: Jun. 27, 2023

(54) AIRFLOW MANAGEMENT SYSTEM THAT CAN BE FITTED TO AN ELECTRICAL ENCLOSURE

(71) Applicant: Schneider Electric Industries SAS, Rueil Malmaison (FR)

(72) Inventors: Louis Linares, La Terrasse (FR); Josep Lopez, Barcelona (ES)

(73) Assignee: Schneider Electric Industries SAS, Rueil Malmaison (FR)

( * ) Notice: Subject to any disclaimer, the term of this patent is extended or adjusted under 35 U.S.C. 154(b) by 830 days.

(21) Appl. No.: 16/695,600

(22) Filed: Nov. 26, 2019

(65) Prior Publication Data

US 2020/0187384 A1  Jun. 11, 2020

(30) Foreign Application Priority Data

Dec. 7, 2018  (FR) .................................. FR1872473

(51) Int. Cl.
*H05K 7/20* (2006.01)
*H02B 1/56* (2006.01)

(52) U.S. Cl.
CPC ......... *H05K 7/20209* (2013.01); *H02B 1/565* (2013.01); *H05K 7/20172* (2013.01)

(58) Field of Classification Search
CPC . H05K 7/20209; H05K 7/20172; H02B 1/565
USPC ....................................................... 454/184
See application file for complete search history.

(56) References Cited

U.S. PATENT DOCUMENTS

| | | | |
|---|---|---|---|
| 6,108,203 A | | 8/2000 | Dittus et al. |
| 10,892,606 B2 * | | 1/2021 | Linares .............. H05K 7/20145 |
| 2003/0224717 A1 | | 12/2003 | Tsai et al. |
| 2007/0165379 A1 * | | 7/2007 | Chang ................ H05K 7/20181 361/695 |
| 2018/0168068 A1 | | 6/2018 | Linares |

FOREIGN PATENT DOCUMENTS

| | | | |
|---|---|---|---|
| DE | 9408362 U1 | 9/1994 | |
| EP | 3333992 | 6/2018 | |
| JP | 10108323 A * | 4/1998 | ............. H02B 1/565 |

OTHER PUBLICATIONS

English Language Machine Translation of German Patent Publication No. DE9408362U1 dated Sep. 8, 1994, 11 pages.
Search Report and Written Opinion for French Patent Application No. 1872473 dated Aug. 6, 2019, 6 pages.

* cited by examiner

*Primary Examiner* — Allen R. B. Schult
(74) *Attorney, Agent, or Firm* — Locke Lord LLP

(57) ABSTRACT

An airflow management system that can be fitted to an electrical cabinet intended to accommodate electrical devices in the internal volume thereof, the system comprising:
- a casing comprising at least one air input intended to be placed in communication with the internal volume of the electrical cabinet, at least two air outputs and at least one principal throat arranged to connect the air input to the two air outputs,
- a switch device arranged inside said principal throat, between the first air output and the second air output, the switch device comprising movable flaps that can be controlled between a first position in which the air input communicates solely with the first air output and a second position in which the air input communicates at least with the second air output.

11 Claims, 6 Drawing Sheets

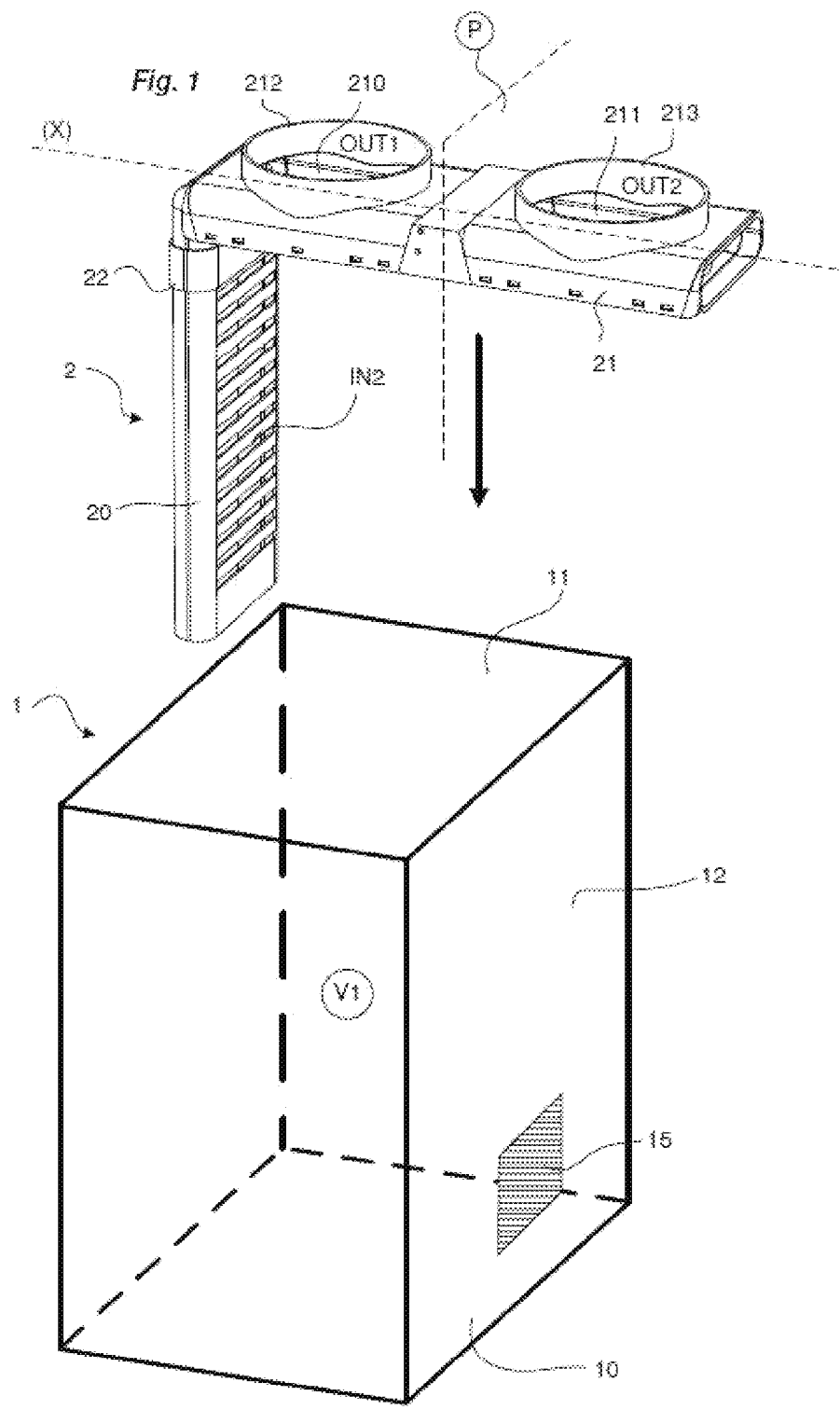

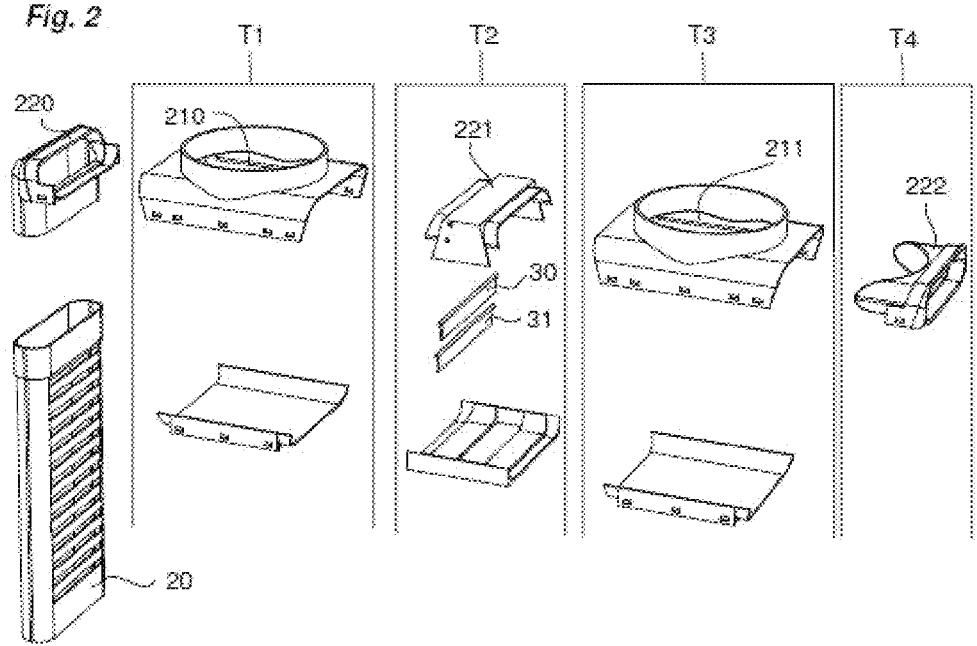

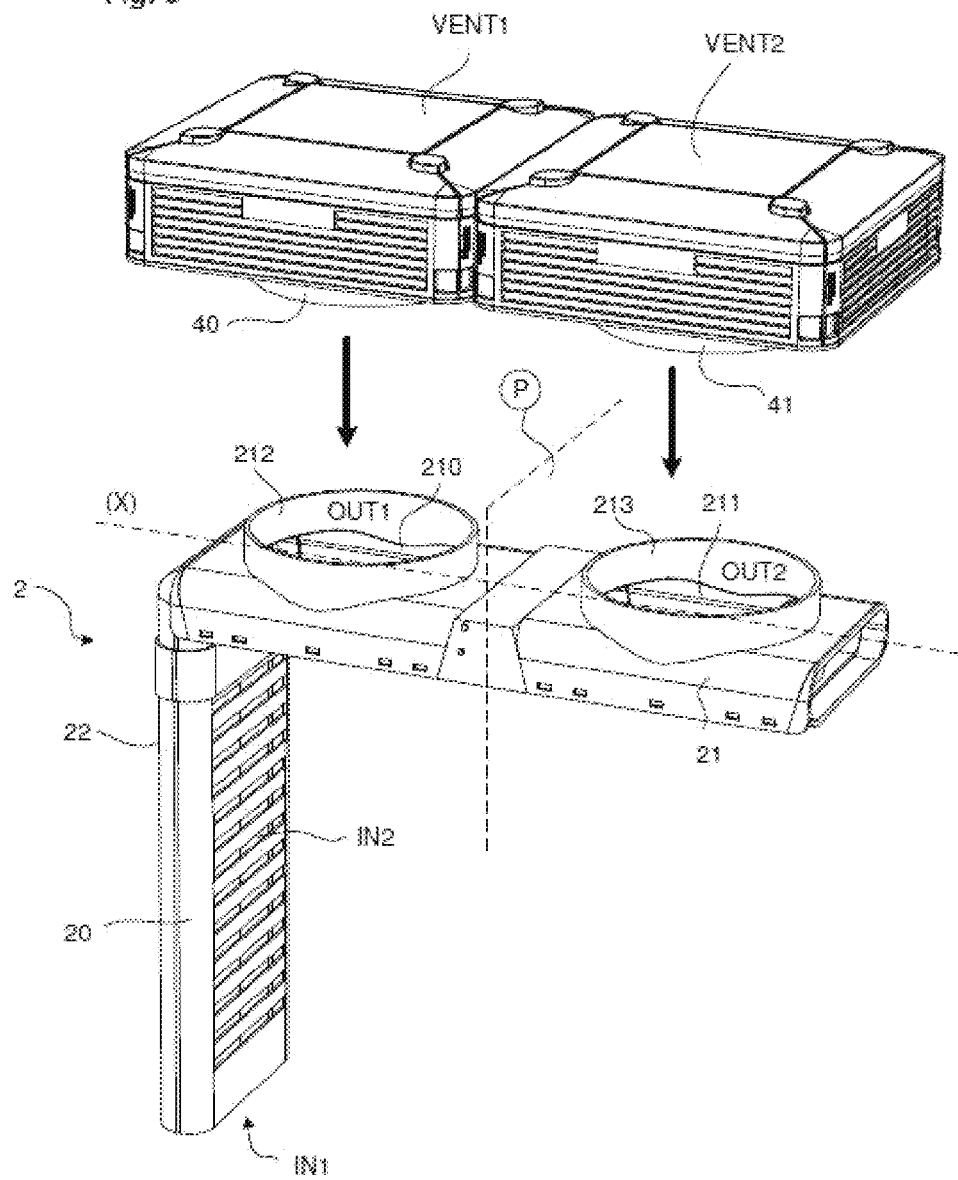

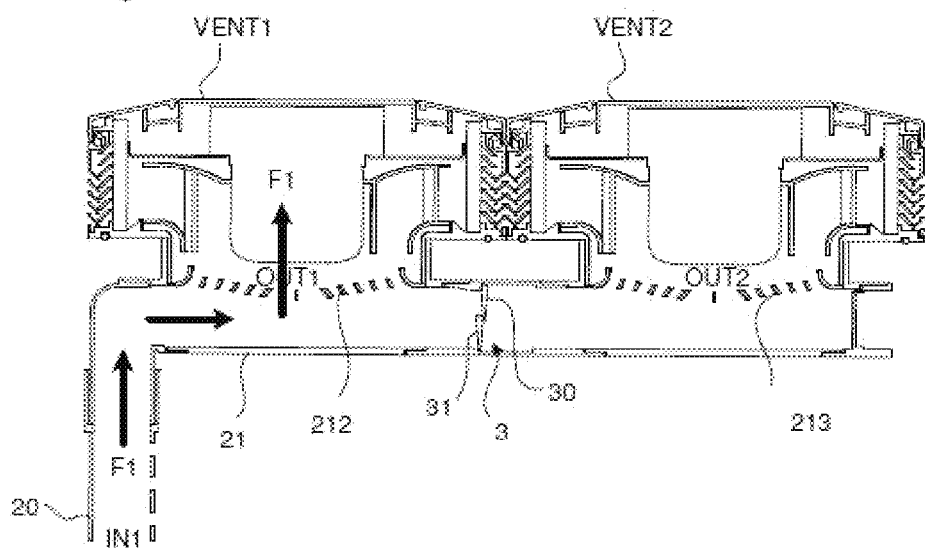
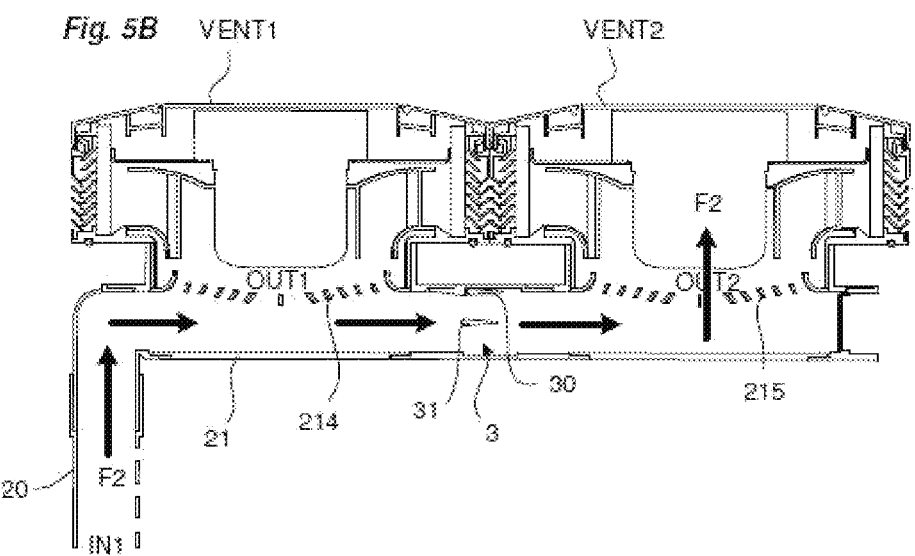

AIRFLOW MANAGEMENT SYSTEM THAT CAN BE FITTED TO AN ELECTRICAL ENCLOSURE

TECHNICAL FIELD OF THE INVENTION

The present invention relates to an airflow management system that can be fitted to an electrical cabinet such as an electrical enclosure.

The invention also relates to an electrical installation comprising an electrical cabinet on which said airflow management system is fitted.

PRIOR ART

Managing the temperature within an electrical cabinet, such as an electrical enclosure or an electrical panel, is a question that receives frequent attention. The equipment present in the electrical enclosure tends to heat up and so it is necessary to keep the temperature inside the enclosure below a given threshold, lest the equipment suffer. To address this constraint, it is conventional to use a ventilation system to establish a flow of air through the volume of the electrical enclosure by drawing air in from outside and expelling the hot air present in the enclosure to the outside.

Known ventilation systems are in particular placed on the upper wall of the electrical enclosure. They comprise an input connected to the internal volume of the enclosure in order to receive an outward flow of air, an air output and a fan placed between the input and the output in order to draw the flow of air from the input towards the output.

It is known that these ventilation solutions are often liable to fail, which then requires the intervention of an operator to carry out repairs. Moreover, when a fan develops a fault, the temperature inside the electrical enclosure may become critical, with an appreciable risk of damage to the electrical devices. The safest solution is then to shut everything down while waiting for the ventilation system to be repaired. However, prolonged shutdown is often not acceptable, in particular for economic reasons.

The aim of the invention is to propose an airflow management system that can be fitted to an electrical cabinet such as an electrical enclosure. This system has the characteristic of remedying the drawbacks of the prior art by making it possible to prolong the operation of the ventilation for the electrical cabinet, in the event of the fan being faulty, without the intervention of an operator.

SUMMARY OF THE INVENTION

This aim is achieved with an airflow management system that can be fitted to an electrical cabinet which comprises multiple walls bounding an internal volume intended to accommodate electrical devices, said system comprising:
- a casing comprising at least one air input intended to be brought into communication with the internal volume of the electrical cabinet, at least two air outputs and at least one principal throat arranged to connect said air input to the two air outputs,
- a switch device arranged inside said principal throat, between the first air output and the second air output, said switch device comprising one or more movable flaps that can be controlled between a first position in which the air input communicates solely with the first air output and a second position in which the air input communicates at least with the second air output.

According to one feature, the principal throat comprises:
- a first opening forming said first air output,
- a second opening forming said second air output,
- a single airflow transport channel connecting said air input to the first air output and to the second air output.

According to another feature, said movable flaps are interposed in said transport channel between the first air output and the second air output.

According to another feature, said movable flaps are mounted so as to be free to pivot between said first position and said second position.

According to another feature, the movable flaps are mounted so as to be free to pivot in a single direction, from said first position to said second position, solely under the pressure of the flow of air flowing in said channel.

According to another feature, said casing comprises a first accommodating portion arranged to receive a first fan and a second accommodating portion arranged to receive a second fan, said first accommodating portion comprising said first opening forming the first air output and said second accommodating portion comprising said second opening forming said second air output.

According to another feature, the system comprises a grid positioned in each accommodating portion and arranged between the air output and said transport channel.

According to another feature, the system comprises an input throat connected to the principal throat and comprising at least one first end on which there is created an axial air input and a second end connected to the principal throat.

According to another feature, the input throat comprises multiple lateral openings, each forming a distinct air input of the system.

The invention also relates to an electrical installation comprising an electrical cabinet which comprises a lower wall, an upper wall and at least one lateral wall, so as to delimit a first internal volume intended to receive electrical devices, said installation comprising:
- a system as defined hereinabove which is installed on one of its walls, said air input being connected to said internal volume of the electrical enclosure,
- a ventilation system comprising a first fan connected on the first air output of the system and a second fan connected on the second air output of the system.

According to another feature, the electrical cabinet comprises a grid placed in front of an opening created through one of its walls.

BRIEF DESCRIPTION OF THE FIGURES

Other features and advantages will appear in the following detailed description given with regard to the appended drawings, in which:

FIG. 1 shows, in perspective, the airflow management system of the invention that can be fitted to an electrical cabinet.

FIG. 2 shows the system of the invention, in an exploded view.

FIG. 3 shows the system of the invention and a ventilation system intended to be fitted to the system of the invention.

FIGS. 5A and 5B show, in longitudinal section, the system of the invention in its two operating states.

DETAILED DESCRIPTION OF AT LEAST ONE EMBODIMENT

Figure 4A:
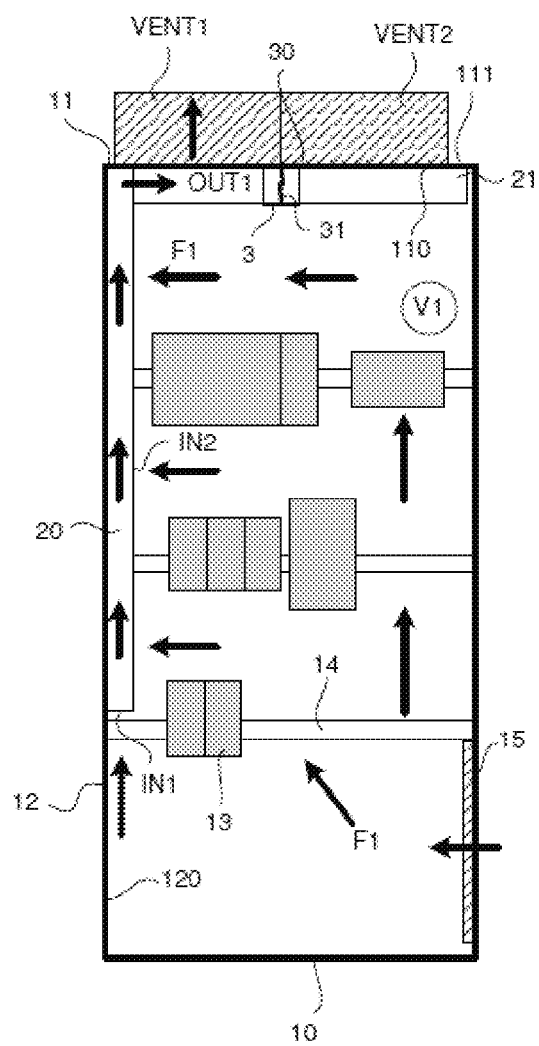
FIGS. 4A and 4B illustrate, schematically, the operating principle of the system of the invention, respectively in its two operating states.

With reference to FIG. 1, the airflow management system 2 of the invention can be fitted to an electrical cabinet. An electrical cabinet is to be understood as an electrical enclosure, an electrical panel or the like. In the remainder of the description and in the drawings, the electrical cabinet will be considered to be an electrical enclosure 1.

In the remainder of the description, the terms "upstream" and "downstream" are to be considered in the context of the direction of the airflow flowing in the system.

In a non-limiting manner, an electrical enclosure 1 may comprise a lower wall 10, an upper wall 11 and four lateral walls 12 in mutually opposite pairs. These walls bound a first internal volume V1 in which electrical devices are placed. In the electrical enclosure, the electrical devices 13 may be mounted on supports, such as suitable uprights and rails 14 (see FIGS. 4A and 4B). The electrical enclosure 1 comprises a grid 15 (FIGS. 4A and 4B) which permits an exchange of air between the internal volume and the exterior.

The electrical enclosure 1 may be made of a metal material.

Non-limitingly but advantageously, the airflow management system 2 in accordance with the invention is inserted partially or totally into the volume of the electrical enclosure and can be attached to the upper wall 11 of the electrical enclosure, on the lower face 110 of this upper wall 11. Moreover, the two fans of the ventilation system are positioned on the upper face 111 of this upper wall 11.

The invention relates to a system 2 which provides, in a simple way, redundancy between at least two fans of a given ventilation system associated with a single electrical enclosure. Redundancy is to be understood as meaning that the system 2 allows the second fan VENT2 to take over from the first fan VENT1 in the event of a fault with this first fan, and thus to manage the airflow passing through the internal volume of the electrical enclosure.

The system 2 of the invention is designed to be inserted into the volume V1 of the electrical enclosure upstream of the ventilation system, and thus fits between the electrical enclosure 1 and the ventilation system to permit the redundancy.

The system of the invention advantageously comprises at least one air input IN1, IN2 and at least two air outputs OUT1, OUT2. In the remainder of the description, it will be seen that the system 2 may comprise multiple air inputs (referenced IN1 and IN2), even if these all have an equivalent function.

Each air input IN1, IN2 is intended to be in communication with the internal volume V1 of the electrical enclosure. It can be noted that the grid 15 present on the electrical enclosure 1 can be placed opposite each air input IN1, IN2 in order to promote the flow of air in the electrical enclosure 1.

A first fan VENT1 is associated with the first air output such that, when running, it generates a first airflow F1 from each air input IN1, IN2 of the system through the first air output OUT1, and a second fan VENT2 is associated with the second air output such that, when running, it generates a second airflow F2 from each air input IN1, IN2 of the system through the second air output OUT2.

As illustrated in FIG. 2, the system 2 comprises a one-piece casing 22 that is obtained by joining multiple elements together.

Figure 4B:
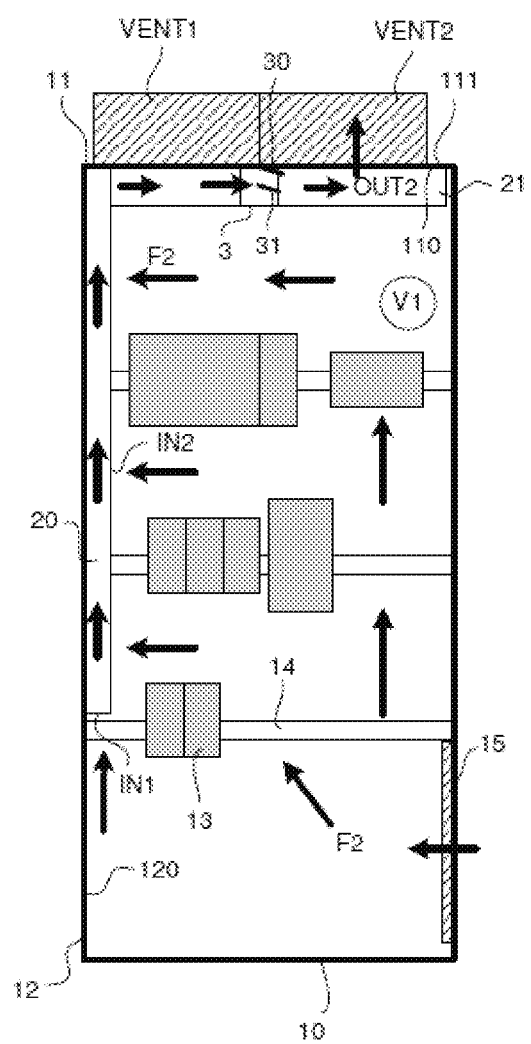

Among the elements of the casing 22, the system 2 comprises a first throat 20 on which each air input IN1, IN2 is created. This first throat 20 of the system is located inside the electrical enclosure 1 or outside the electrical enclosure. Advantageously, and as shown in the appended figures, this throat 20 may comprise an axial air input IN1 at one end and multiple lateral air inputs IN2 over its entire length, each air input being in communication with the internal volume V1 of the electrical enclosure 1 so as to draw in the air present in the electrical enclosure 1. This throat 20 may be configured to run along one of the lateral walls 12 of the electrical enclosure, either inside or outside. If it is located outside the enclosure, each one of its air inputs must be in sealed communication with the internal volume V1 of the electrical enclosure. If it is located inside the enclosure (as shown in FIGS. 4A and 4B), it can bear against the internal face 120 of the lateral wall 12 and its air inputs are located directly in the internal volume V1 of the enclosure. It can be noted that the system 2 could comprise multiple air input throats of this type, distributed over the lateral walls 12 of the electrical enclosure 1.

Among the elements of the casing 22, the system also comprises a second throat 21 that is elongate along a principal axis (X) and defines a principal channel along said axis, through which the airflow flows. This second throat 21 extends the first throat 20 in the downstream direction. It comprises an air input to which is connected the second end of the first throat 20, an internal channel and a second, closed-off end.

The two throats 20, 21 form a right angle between them. Thus, when the system 2 is fitted to the electrical enclosure 1, the second throat 21 may be positioned against the lower face 110 of the upper wall 11 of the electrical enclosure 1 and the first throat 20 runs along the internal face 120 of the lateral wall 12.

Non-limitingly, the two throats may have an oblong-shaped cross section.

With reference to FIG. 2, the casing 22 may comprise joining elements 220, 221, 222 which serve to join its elements to one another. The casing may comprise an elbow element 220 that serves to join together the two throats 20, 21, an intermediate element 221 for joining together multiple elements forming the second throat 21 and an end element 222 that serves to close off the free end of the second throat. The second throat 21 itself can be made in four segments which are, from upstream to downstream:

a first segment T1 bearing the first air output OUT1,
  a second segment T2 comprising the intermediate element 221 and bearing the switch device 3 (see below),
  a third segment T3 bearing the second air output OUT2,
  a fourth segment D4 comprising the end element 222.

Moreover, each segment can be made in two matching parts that can be joined to one another on either side of the axis (X) to create the channel of the throat 21.

The second throat 21 comprises two lateral (with respect to the axis (X)) through-openings 210, 211, each intended to be opposite a corresponding distinct opening through the upper wall 11 of the electrical enclosure 1. Each one of the openings 210, 211 defines a seat 212, 213 (FIG. 3) or accommodating portion at which a fan VENT1, VENT2 of the ventilation system, positioned on the other side of the wall 11 of the electrical enclosure 1, is to be connected. To that end, each fan may comprise a connection sleeve 40, 41 that is intended to pass through the upper wall 11 of the electrical enclosure to fit onto the corresponding seat 212, 213 of the system.

Each one of these openings 210, 211 may have a circular rim. They each form one of the two air outputs OUT1, OUT2 of the system 2 and communicate directly with the channel of this second throat 21.

The second opening 211 is created downstream from the first opening 210, following the length of the principal channel.

The two openings 210, 211 are advantageously identical.

The two openings 210, 211 are advantageously created symmetrically with respect to a plane P that is transverse to the direction of the airflow (F1 or F2) in the second throat, and thus transverse to the principal axis (X) of the second throat 21.

The system 2 may comprise a filtering grid 214, 215 positioned opposite each opening for filtering the outgoing airflow.

With the exception of each air input IN1, IN2 and the two air outputs OUT1, OUT2, the elements of the system of the invention are assembled hermetically with respect to the outside.

According to one feature, the two air outputs OUT1, OUT2 are arranged in parallel on the principal channel of the system.

The system of the invention also comprises a switch device 3 for the flow of air entering the system.

This switch device 3 is arranged inside the second throat 21 and is interposed between the first air output OUT1 and the second air output OUT2.

This switch device comprises one or more movable flaps. By way of example, and non-limitingly, the appended figures show two movable flaps 30, 31.

Each movable flap 30, 31 is mounted so as to be able to pivot about an axis. The pivot axes of all of the flaps are mutually parallel and are oriented parallel to said transverse plane P.

The two movable flaps 30, 31 are for example superposed so as to extend over the entire flow cross section of the airflow within the throat.

Advantageously, the two movable flaps 30, 31 are controlled simultaneously.

Advantageously, the two movable flaps 30, 31 can be controlled solely under the pressure of the flow of air flowing in the second throat, along the axis (X).

The two movable flaps 30, 31 are able to adopt a first, "closed" position in which they close off the connection between each air input IN1, IN2 and the second air output OUT2 (FIGS. 4A and 5A), and a second, "open" position in which they permit the connection between each air input IN1, IN2 and the second air output OUT2 (FIGS. 4B and 5B).

To pass from their first position to their second position, the movable flaps 30, 31 may be mounted so as to pivot in a single direction of rotation, corresponding to the direction defined by the airflow F2 in the throat when the second fan VENT2 is running.

Thus, to pass from their first position to their second position, the movable flaps 30, 31 pivot in a first direction of rotation (for example anticlockwise), and then to return to their first position they pivot in a second direction of rotation (clockwise).

Non-limitingly, the movable flaps 30, 31 may each be spring-mounted. The pressure of each spring can be adjusted to allow the flap to pivot when a minimum air pressure is applied. The airflow F2 generated by the second fan VENT2 alone must be sufficient to produce a pressure greater than said minimum pressure required for pivoting.

According to one particular embodiment, it would be possible to provide different pivoting settings for the two movable flaps 30, 31, by adjusting the force of their respective spring. In that scenario, the first movable flap 30 would be allowed to pivot first, when the pressure from the airflow exceeds a first threshold, and then the second movable flap 31 would be allowed to pivot, in addition to the first flap, when a second pressure threshold is exceeded, this second pressure threshold being greater than the first pressure threshold. This solution would make it possible to easily adjust the flow of air leaving via each of the two air outputs.

With reference to FIGS. 4A, 5A and 4B, 5B, the operation of the system of the invention is then as follows:

FIGS. 4A and FIG. 5A—first operating state: The first fan VENT1 is running and the second fan VENT2 is stopped. The airflow F1 drawn from inside the electrical enclosure enters the system via each air input IN1, IN2, passes into the first throat 20 and thence the second throat 21. Since the first fan VENT1 is running, the airflow F1 is drawn towards the first air output OUT1 of the system and escapes to the outside via the first air output and the first fan. Since the second fan VENT2 is stopped, no flow of air pushes against the movable flaps 30, 31, and so these remain in their closed position.

FIGS. 4B and FIG. 5B—second operating state: The first fan VENT1 is stopped (it is for example broken down or undergoing maintenance, or the like). The second fan VENT2 is running. The airflow F2 drawn from inside the volume V1 of the electrical enclosure 1 enters the system 2 via each air input IN1, IN2, passes into the first throat 20 and thence the second throat 21. Since the first fan VENT1 is stopped and the second fan VENT2 is running, the airflow F2 is directed towards the second air output OUT2. The airflow F2 presses on the movable flaps 30, 31 and pushes against them so as to make them pivot. Thus, the airflow F2 passes through the opening that is created by the pivoting of the flaps, and reaches the second air output OUT2 whence it is expelled to the outside by means of the second fan VENT2.

It is to be noted that the detection of the stoppage of the first fan VENT1 and the activation of the second fan VENT2 can be done by any means, automatic and/or manual.

It is also possible to provide, in the system and for each movable flap 30, 31, a position sensor that is connected to a central control unit and is intended to detect the open or closed position of each flap and thus verify their correct operation. The position sensor may be a mechanical sensor of the end-of-travel type.

Simultaneous activation of both fans VENT1, VENT2 can also be provided, for example to allow one of the two fans to operate in a slowed-down mode, or to generate a larger airflow in the electrical enclosure 1. In this situation, pivoting of the movable flaps 30, 31 must be adjusted to allow some of the airflow to also reach the second air output OUT2, in addition to the first air output OUT1.

The solution of the invention therefore presents numerous advantages, among which:
- a simple solution for implementing redundancy between the two fans;
- a reliable solution since it requires no particular control, the movable flaps moving under the pressure of the airflow;
- a solution that is easy to fit to an existing enclosure, this being independent of the architecture of the electrical enclosure;
- a solution serving to ensure continuity of operation, even in the event of partial breakdown of the ventilation system.

The invention claimed is:

1. Airflow management system that can be fitted to an electrical cabinet which comprises a lower wall, a top wall and at least one lateral bounding an internal volume intended to accommodate electrical devices, the system comprising:

a casing comprising at least one air input intended to be placed in communication with the internal volume of the electrical cabinet, at least two air outputs, at least one principal throat arranged to connect said at least one air input to the two air outputs, and an input throat connected to the principal throat, the input throat having at least one first end on which there is an axial air input of the at least one air input and a second end connected to a first end of the principal throat at the first end of the principal throat, the input throat running along a lateral wall of the at least one lateral wall of the electrical cabinet, a switch device arranged inside said principal throat, between the first air and the second air output, said switch device comprising at least one movable flap that can be controlled between a first position, in which the air input communicates solely with the first air output, and a second position, in which the air input communicates at least with the second air each of the at least two air outputs being arranged to connect to a respective fan of at least two fans, and wherein the input throat comprises multiple lateral openings, each lateral opening forming an air input distinct from the axial air input.

2. System according to claim 1, wherein the principal throat comprises:

a first opening forming said first air output, a second opening forming said second air output, a single airflow transport channel connecting said air input to the first air output and to the second air output.

3. System according to claim 2, wherein said movable flap is interposed in said transport channel between the first air output and the second air output.

4. System according to claim 3, wherein said movable flap is mounted so as to be free to pivot between said first position and said second position.

5. System according to claim 4, wherein the movable flap is mounted so as to be free to pivot in a single direction, from said first position to said second position, solely under the pressure of the flow of air flowing in said channel.

6. System according to claim 2, wherein said casing comprises a first accommodating portion arranged to receive a first fan of the at least two fans and a second accommodating portion arranged to receive a second fan of the at least two fans, said first accommodating portion comprising said first opening forming the first air output and said second accommodating portion comprising said second opening forming said second air output.

7. System according to claim 6, further comprising a grid positioned in each accommodating portion and arranged between the air output and said transport channel.

8. Electrical installation comprising an electrical cabinet which comprises a lower wall, an upper wall and at least one lateral wall, so as to delimit a first internal volume intended to receive electrical devices, wherein the installation comprises:

a system as defined in claim 1 which is installed on one of its walls, said air input being connected to said internal volume of the electrical enclosure, a ventilation system comprising a first fan of the at least two fans connected on the first air output of the system and a second fan of the at least two fans connected on the second air output of the system.

9. Electrical installation according to claim 8, wherein the electrical cabinet comprises a grid placed in front of an opening created through one of its walls.

10. System according to claim 1, wherein the principal throat and the input throat are at right angles to one another.

11. System according to claim 1, wherein the principal throat is elongate along a principal axis and defines a principal channel along the principal axis through which air is configured to flow, and wherein the lateral wall along which the input throat runs is a lateral wall perpendicular to the principal axis.

* * * * *